United States Patent
Loh

(10) Patent No.: US 7,264,378 B2
(45) Date of Patent: Sep. 4, 2007

(54) POWER SURFACE MOUNT LIGHT EMITTING DIE PACKAGE

(75) Inventor: Ban P. Loh, Durham, NC (US)

(73) Assignee: Cree, Inc., Durham, NC (US)

( * ) Notice: Subject to any disclaimer, the term of this patent is extended or adjusted under 35 U.S.C. 154(b) by 21 days.

(21) Appl. No.: 10/446,532

(22) Filed: May 27, 2003

(65) Prior Publication Data

US 2004/0041222 A1    Mar. 4, 2004

Related U.S. Application Data

(60) Provisional application No. 60/408,254, filed on Sep. 4, 2002.

(51) Int. Cl.
*F21V 29/00* (2006.01)
*H01L 31/0203* (2006.01)

(52) U.S. Cl. .................. 362/294; 257/98; 257/100

(58) Field of Classification Search .............. 362/294, 362/800; 257/98, 707, 712, 100; 361/704; 313/502, 512
See application file for complete search history.

(56) References Cited

U.S. PATENT DOCUMENTS

| | | | | |
|---|---|---|---|---|
| 3,760,237 A | * | 9/1973 | Jaffe | ............... 257/98 |
| 4,152,618 A | | 5/1979 | Abe et al. | |
| 4,267,559 A | | 5/1981 | Johnson et al. | |
| 5,173,839 A | | 12/1992 | Metz, Jr. | ............... 361/706 |
| 5,785,418 A | | 7/1998 | Hochstein | ............... 362/373 |
| 5,789,772 A | | 8/1998 | Jiang | ............... 257/96 |
| 5,841,177 A | | 11/1998 | Komoto et al. | ............... 257/431 |

(Continued)

FOREIGN PATENT DOCUMENTS

EP    1 059 678 A2    12/2000

(Continued)

OTHER PUBLICATIONS

Entitled, "LED Package with a Long Stem Body as Heat-Spreader and a Small Footprint." U.S. Appl. No. 60/431,501, Inventor: Ban Poh Loh. Filing date: Dec. 6, 2002. 10 pages.

(Continued)

*Primary Examiner*—Ali Alavi
(74) *Attorney, Agent, or Firm*—Harness, Dickey & Pierce, P.L.C.

(57) ABSTRACT

A light emitting die package is disclosed. The die package includes a substrate, a reflector plate, and a lens. The substrate is made from thermally conductive but electrically insulating material. The substrate has traces for connecting an external electrical power source to a light emitting diode (LED) at a mounting pad. The reflector plate is coupled to the substrate and substantially surrounds the mounting pad. The lens is free to move relative to the reflector plate and is capable of being raised or lowered by the encapsulant that wets and adheres to it and is placed at an optimal distance from the LED chip(s). The lens can be coated with any optical system of chemical that affects the performance of the device. Heat generated by the LED during operation is drawn away from the LED by both the substrate (acting as a bottom heat sink) and the reflector plate (acting as a top heat sink). The reflector plate includes a reflective surface to direct light from the LED in a desired direction.

24 Claims, 6 Drawing Sheets

U.S. PATENT DOCUMENTS

| | | | |
|---|---|---|---|
| 5,869,883 A | 2/1999 | Mehringer et al. | 257/667 |
| 5,907,151 A * | 5/1999 | Gramann et al. | 250/214.1 |
| 5,959,316 A | 9/1999 | Lowery | 257/98 |
| 5,998,925 A | 12/1999 | Shimizu et al. | 313/503 |
| 6,060,729 A * | 5/2000 | Suzuki et al. | 257/99 |
| 6,238,599 B1 | 5/2001 | Gelorme et al. | 252/514 |
| 6,274,924 B1 | 8/2001 | Carey et al. | 257/676 |
| 6,307,272 B1 | 10/2001 | Takahashi et al. | |
| 6,318,886 B1 | 11/2001 | Stopa et al. | |
| 6,329,706 B1 | 12/2001 | Nam | 257/666 |
| 6,335,548 B1 | 1/2002 | Roberts et al. | 257/98 |
| RE37,707 E | 5/2002 | Bozzini et al. | 257/675 |
| 6,429,513 B1 | 8/2002 | Shermer, IV et al. | 257/714 |
| 6,444,498 B1 | 9/2002 | Huang et al. | 438/126 |
| 6,456,766 B1 | 9/2002 | Shaw et al. | 385/47 |
| 6,457,645 B1 | 10/2002 | Gardner, Jr. | 235/462.23 |
| 6,468,821 B2 | 10/2002 | Maeda et al. | 438/29 |
| D465,207 S | 11/2002 | Williams et al. | D13/182 |
| 6,480,389 B1 * | 11/2002 | Shie et al. | 361/707 |
| 6,492,725 B1 | 12/2002 | Loh et al. | 257/723 |
| 6,501,103 B1 * | 12/2002 | Jory et al. | 257/100 |
| 6,531,328 B1 | 3/2003 | Chen | |
| 6,541,800 B2 | 4/2003 | Barnett et al. | |
| 6,559,525 B2 | 5/2003 | Huang | |
| 6,680,491 B2 | 1/2004 | Nakanishi et al. | |
| 6,680,568 B2 * | 1/2004 | Fujiwara et al. | 313/501 |
| 6,707,069 B2 * | 3/2004 | Song et al. | 257/79 |
| 2002/0113244 A1 | 8/2002 | Barnett et al. | |
| 2003/0057573 A1 | 3/2003 | Sekine et al. | |
| 2003/0168670 A1 | 9/2003 | Roberts et al. | |
| 2003/0168720 A1 | 9/2003 | Kamada | |
| 2003/0193080 A1 | 10/2003 | Cabahug et al. | |
| 2003/0193083 A1 | 10/2003 | Hiroto | |
| 2004/0079957 A1 | 4/2004 | Andrews et al. | |
| 2004/0173804 A1 | 9/2004 | Yu | |

FOREIGN PATENT DOCUMENTS

| | | |
|---|---|---|
| JP | 2002103977 | 4/2002 |
| JP | 2003298117 | 10/2003 |

OTHER PUBLICATIONS

Entitled, "Leadframe Based LED or Semiconductor Package with Improved Heat Spreading." U.S. Appl. No. 60/431,523, Inventor: Ban Poh Loh. Filing date: Dec. 6, 2002.

Entitled: Power surface mount light emitting die package, U.S. Appl. No. 10/692,351, Inventor(s): Peter Scott Andrews, Ban P. Loh, Durham, Filing date: Oct. 22, 2003, Published date: Mar. 29, 2004.

Entitled: Composite leadframe LED package and method of making the same, U.S. Appl. No. 10/721,654, Inventor(s): Ban P. Loh, Filing date: Nov. 25, 2003, Published date: Jul. 1, 2004.

Entitled: LED package die having a small footprint, U.S. Appl. No. 10/721,641, Inventor(s): Ban P. Loh, Filing date: Nov. 25, 2003, Published date: Jul. 1, 2004.

Entitled: Power light emitting die package with reflecting lens and the method of making the same, U.S. Appl. No. 10/861,929, Inventor(s): Ban P. Loh, Gerald H. Negley, Filing date: Jul. 4, 2004, Published date: Not yet published.

Entitled: Composite optical lens with an integrated reflector, U.S. Appl. No. 10/861,639, Inventor(s): Ban P. Loh, Gerald H. Negley, Filing date: Jul. 4, 2004, Published date: Not yet published.

* cited by examiner

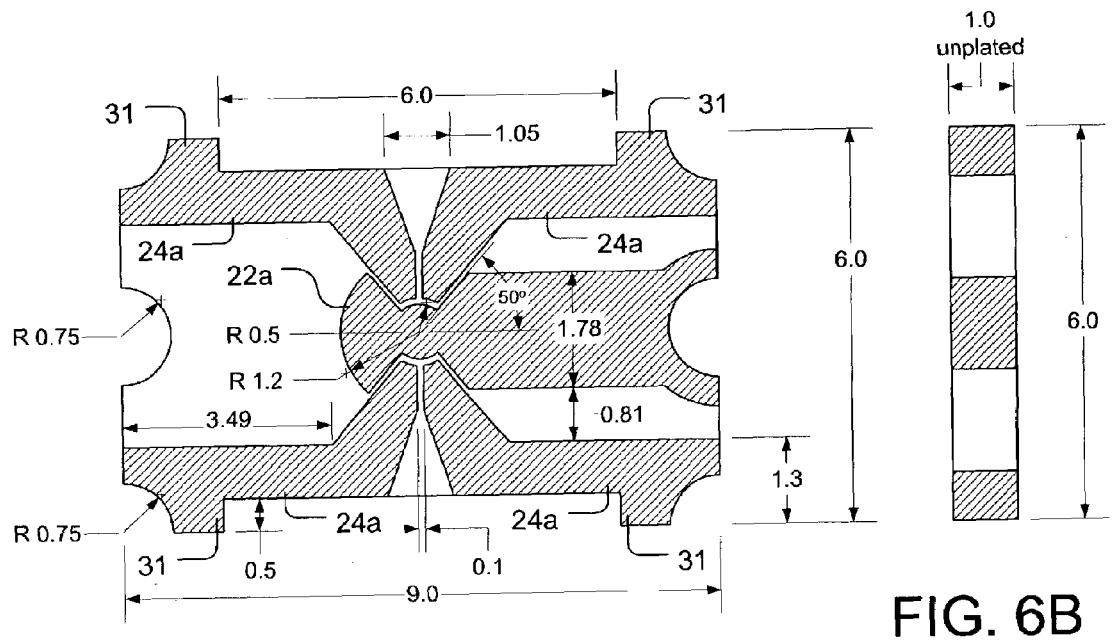
FIG. 6A
FIG. 6B
FIG. 6C
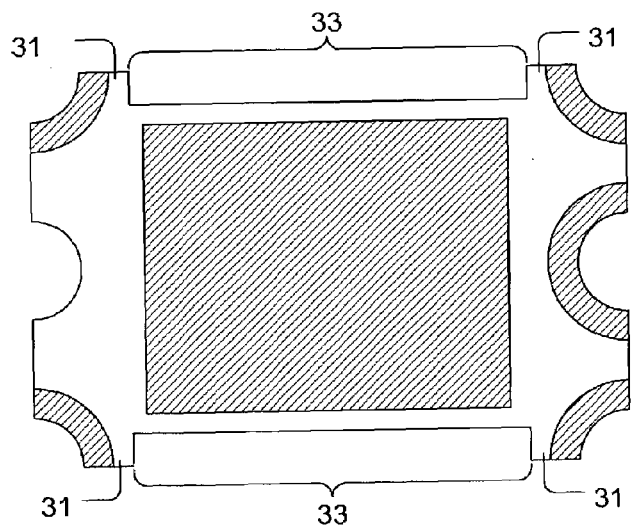
FIG. 6D

POWER SURFACE MOUNT LIGHT EMITTING DIE PACKAGE

PRIORITY

This application claims the benefit of U.S. Provisional Patent Application No. 60/408,254 filed Sep. 4, 2002 entitled "Power-SMT, LED Package with Dual Heat-Sinks and an Optical System or Chemical-Coated Lens."

BACKGROUND

The present invention relates to the field of packaging semiconductor devices, and more particularly to packaging light emitting diodes.

Light emitting diodes (LEDS) are often packaged within leadframe packages. A leadframe package typically includes a molded or cast plastic body that encapsulates an LED, a lens portion, and thin metal leads connected to the LED and extending outside the body. The metal leads of the leadframe package serve as the conduit to supply the LED with electrical power and, at the same time, may act to draw heat away from the LED. Heat is generated by the LED when power is applied to the LED to produce light. A portion of the leads extends out from the package body for connection to circuits external to the leadframe package.

Some of the heat generated by the LED is dissipated by the plastic package body; however, most of the heat is drawn away from the LED via the metal components of the package. The metal leads are typically very thin and has a small cross section. For this reason, capacity of the metal leads to remove heat from the LED is limited. This limits the amount of power that can be sent to the LED thereby limiting the amount of light that can be generated by the LED.

To increase the capacity of an LED package to dissipate heat, in one LED package design, a heat sink slug is introduced into the package. The heat sink slug draws heat from the LED chip. Hence, it increases the capacity of the LED package to dissipate heat. However, this design introduces empty spaces within the package that is be filled with an encapsulant to protect the LED chip. Furthermore, due to significant differences in CTE (coefficient of thermal expansion) between various components inside the LED package, bubbles tend to form inside the encapsulant or the encapsulant tends to delaminate from various portions within the package. This adversely affects the light output and reliability of the product. In addition, this design includes a pair of flimsy leads which are typically soldered by a hot-iron. This manufacturing process is incompatible with convenient surface mounting technology (SMT) that is popular in the art of electronic board assembly.

In another LED package design, the leads of the leadframe package have differing thicknesses extended (in various shapes and configurations) beyond the immediate edge of the LED package body. A thicker lead is utilized as a heat-spreader and the LED chip is mounted on it. This arrangement allows heat generated by the LED chip to dissipate through the thicker lead which is often connected to an external heat sink. This design is inherently unreliable due to significant difference in coefficient of thermal expansion (CTE) between the plastic body and the leadframe material. When subjected to temperature cycles, its rigid plastic body that adheres to the metal leads experiences high degree of thermal stresses in many directions. This potentially leads to various undesirable results such as cracking of the plastic body, separation of the plastic body from the LED chip, breaking of the bond wires, delaminating of the plastic body at the interfaces where it bonds to various parts, or resulting in a combination of these outcomes. In addition, the extended leads increase the package size and its footprint. For this reason, it is difficult to populate these LED packages in a dense cluster on a printed circuit board (PCB) to generate brighter light.

Another disadvantage of the current leadframe design is that the thick lead cannot be made or stamped into a fine circuit for flip-chip mounting of a LED—which is commonly used by some manufacturers for cost-effective manufacturing and device performance.

Consequently, there remains a need for an improved LED package that overcomes or alleviates one or more of the shortcomings of the prior art packages.

SUMMARY

The need is met by the present invention. Embodiments of the present invention provide a package for a semiconductor die such as a light emitting diode, the package including a substrate having traces for connecting to a light emitting diode at a mounting pad, a reflector plate coupled to the substrate and substantially surrounding the mounting pad, and lens substantially covering the mounting pad.

Other embodiments of the present invention provide a semiconductor die package includes a bottom heat sink and a top heat sink. The bottom heat sink has traces on its top surface. A semiconductor chip is mounted on the top surface of the bottom heat sink and electrically connected to the traces. The top heat sink is coupled to the bottom heat sink.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIG. 6A is a top view of a portion of the semiconductor package of FIG. 5;

FIG. 6B is a side view of a portion of the semiconductor package of FIG. 5;

FIG. 6C is a front view of a portion of the semiconductor package of FIG. 5; and FIG. 6D is a bottom view of a portion of the semiconductor package of FIG. 5.

DETAILED DESCRIPTION

The present invention will now be described with reference to the FIGS. 1 through 6D, which illustrate various embodiments of the present invention. As illustrated in the Figures, the sizes of layers or regions are exaggerated for illustrative purposes and, thus, are provided to illustrate the general structures of the present invention. Furthermore, various aspects of the present invention are described with reference to a layer or structure being formed on a substrate or other layer or structure. As will be appreciated by those of skill in the art, references to a layer being formed "on" another layer or substrate contemplates that additional layers may intervene. References to a layer being formed on another layer or substrate without an intervening layer are described herein as being formed "directly on" the layer or substrate. Furthermore, relative terms such as beneath may be used herein to describe one layer or regions relationship to another layer or region as illustrated in the Figures. It will be understood that these terms are intended to encompass different orientations of the device in addition to the orientation depicted in the Figures. For example, if the device in the Figures is turned over, layers or regions described as "beneath" other layers or regions would now be oriented "above" these other layers or regions. The term "beneath" is intended to encompass both above and beneath in this situation. Like numbers refer to like elements throughout.

As shown in the figures for the purposes of illustration, embodiments of the present invention are exemplified by a light emitting die package including a bottom heat sink (substrate) having traces for connecting to a light emitting diode at a mounting pad and a top heat sink (reflector plate) substantially surrounding the mounting pad. A lens covers the mounting pad. In effect, the die package according to some embodiments of the present invention comprises a two part heat sink with the bottom heat sink utilized (in additional to its utility for drawing and dissipating heat) as the substrate on which the LED is mounted and connected, and the top heat sink utilized (in additional to its utility for drawing and dissipating heat) as a reflector plate to direct light produced by the LED. Because both the bottom and the top heat sinks draw heat away from the LED, more power can be delivered to the LED, and the LED can thereby produce more light.

Further, in the present invention, the body of the die package itself may act as the heat sink removing heat from the LED and dissipating it. For this reason, the LED die package of the present invention may not require a separate heat sink slugs or leads that extend away from the package. Accordingly, the LED die package of the present invention may be more compact, more reliable, and less costly to manufacture than the die packages of the prior art.

Figure 1A:
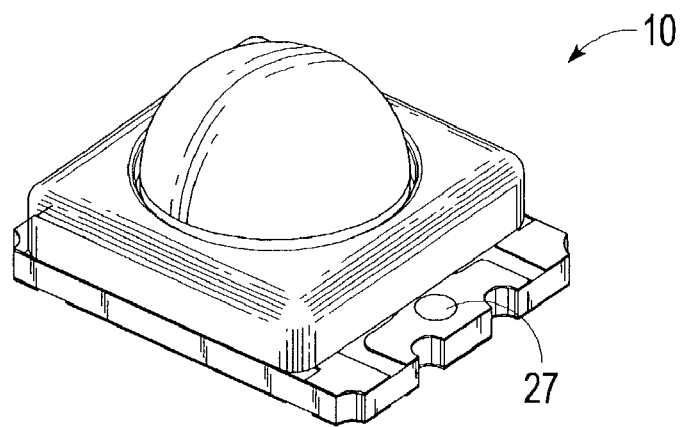
FIG. 1A is a perspective view of a semiconductor die package according to one embodiment of the present invention.
Figure 1B:
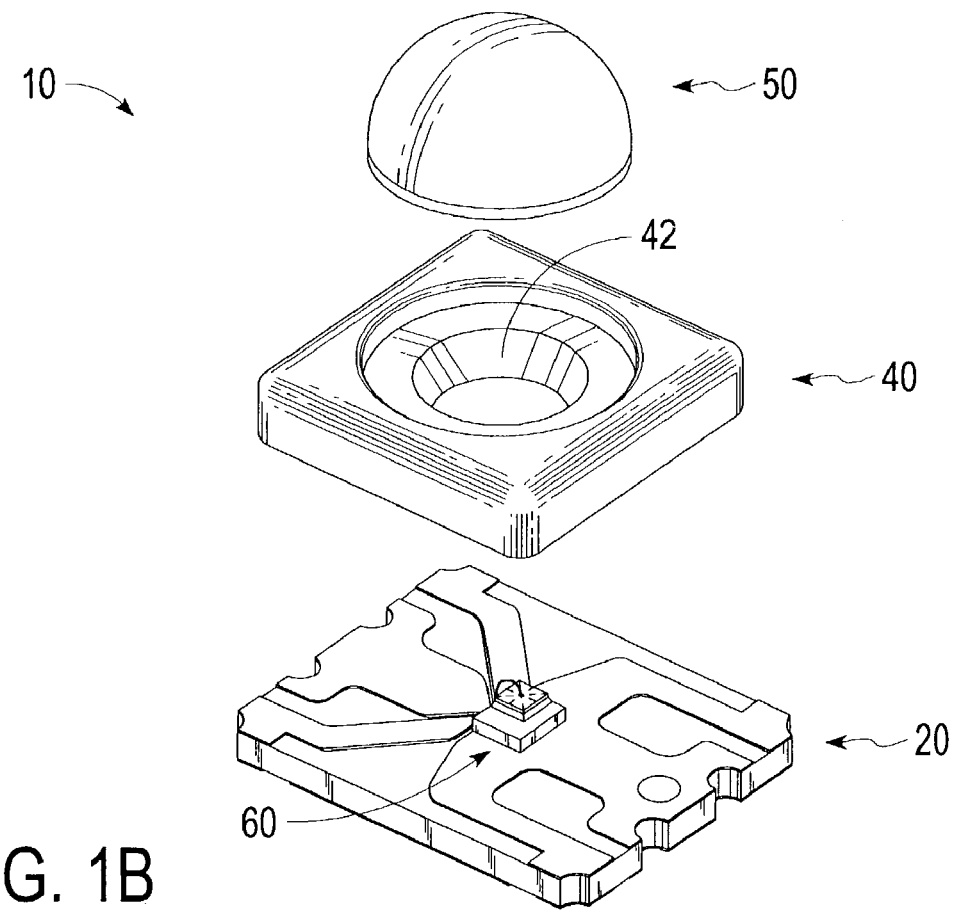
FIG. 1B is an exploded perspective view of the semiconductor package of FIG. 1A.

FIG. 1A is a perspective view of a semiconductor die package 10 according to one embodiment of the present invention and FIG. 1B is an exploded perspective view of the semiconductor package of FIG. 1A. Referring to FIGS. 1A and 1B, the light emitting die package 10 of the present invention includes a bottom heat sink 20, a top heat sink 40, and a lens 50.

The bottom heat sink 20 is illustrated in more detail in FIGS. 2A through 2D. FIGS. 2A, 2B, 2C, and 2D provide, respectively, a top view, a side view, a front view, and a bottom view of the bottom heat sink 20 of FIG. 1A. Further, FIG. 2C also shows an LED assembly 60 in addition to the front view of the bottom heat sink 20. The LED assembly 60 is also illustrated in FIG. 1B. Referring to FIGS. 1A through 2D, the bottom heat sink 20 provides support for electrical traces 22 and 24; for solder pads 26, 32, and 34; and for the LED assembly 60. For this reason, the bottom heat sink 20 is also referred to as a substrate 20. In the Figures, to avoid clutter, only representative solder pads 26, 32, and 34 are indicated with reference numbers. The traces 22 and 24 and the solder pads 32, 34, and 36 can be fabricated using conductive material. Further, additional traces and connections can be fabricated on the top, side, or bottom of the substrate 20, or layered within the substrate 20. The traces 22 and 24, the solder pads 32, 34, and 36, and any other connections can be interconnected to each other in any combinations using known methods, for example via holes.

The substrate 20 is made of material having high thermal conductivity but is electrically insulating, for example, aluminum nitride (AlN) or alumina ($Al_2O_3$). Dimensions of the substrate 20 can vary widely depending on application and processes used to manufacture the die package 10. For example, in the illustrated embodiment, the substrate 20 may have dimensions ranging from fractions of millimeters (mm) to tens of millimeters. Although the present invention is not limited to particular dimensions, one specific embodiment of the die package 10 of the present invention is illustrated in Figures having the dimensions denoted therein. All dimensions shown in the Figures are in millimeters (for lengths, widths, heights, and radii) and degrees (for angles) except as otherwise designated in the Figures, in the Specification herein, or both.

The substrate 20, in the illustrated embodiment, has a top surface 21, the top surface 21 including the electrical traces 22 and 24. The traces 22 and 24 provide electrical connections from the solder pads (for example top solder pads 26) to a mounting pad 28. The top solder pads 26 are portions of the traces 22 and 24 generally proximal to sides of the substrate 20. The top solder pads 26 are electrically connected to side solder pads 32. The mounting pad 28 is a portion of the top surface (including portions of the trace 22, the trace 24, or both) where the LED assembly 60 is mounted. Typically the mounting pad 28 is generally located proximal to center of the top surface 21. In alternative embodiments of the present invention, the LED assembly 60 can be replaced by other semiconductor circuits or chips.

The traces 22 and 24 provide electrical routes to allow the LED assembly 60 to electrically connect to the solder pads 26, 32, or 34. Accordingly, some of the traces are referred to as first traces 22 while other traces are referred to as second traces 24. In the illustrated embodiment, the mounting pad 28 includes portions of both the first traces 22 and the second traces 24. In the illustrated example, the LED assembly 60 is placed on the first trace 22 portion of the mounting pad 28 thereby making contact with the first trace 22. In the illustrated embodiment, top of the LED assembly 60 and the second traces 24 are connected to each other via a bond wire 62. Depending on the construction and orientation of LED assembly 60, first traces 22 may provide anode (positive) connections and second traces 24 may comprise cathode (negative) connections for the LED assembly 60 (or vice versa).

The LED assembly 60 can include additional elements. For example, in FIGS. 1B and 2C, the LED assembly 60 is illustrated including the LED bond wire 62, an LED subassembly 64, and a light emitting diode (LED) 66. Such LED subassembly 64 is known in the art and is illustrated for the purposes of discussing the invention and is not meant to be a limitation of the present invention. In the Figures, the LED assembly 60 is shown die-attached to the substrate 20. In alternative embodiments, the mounting pad 28 can be configured to allow flip-chip attachment of the LED assembly 60. Additionally, multiple LED assemblies can be mounted on the mounting pad 28. In alternative embodiments, the LED assembly 60 can be mounted over multiple traces. This is especially true if flip-chip technology is used.

Figures 2A, 2B:
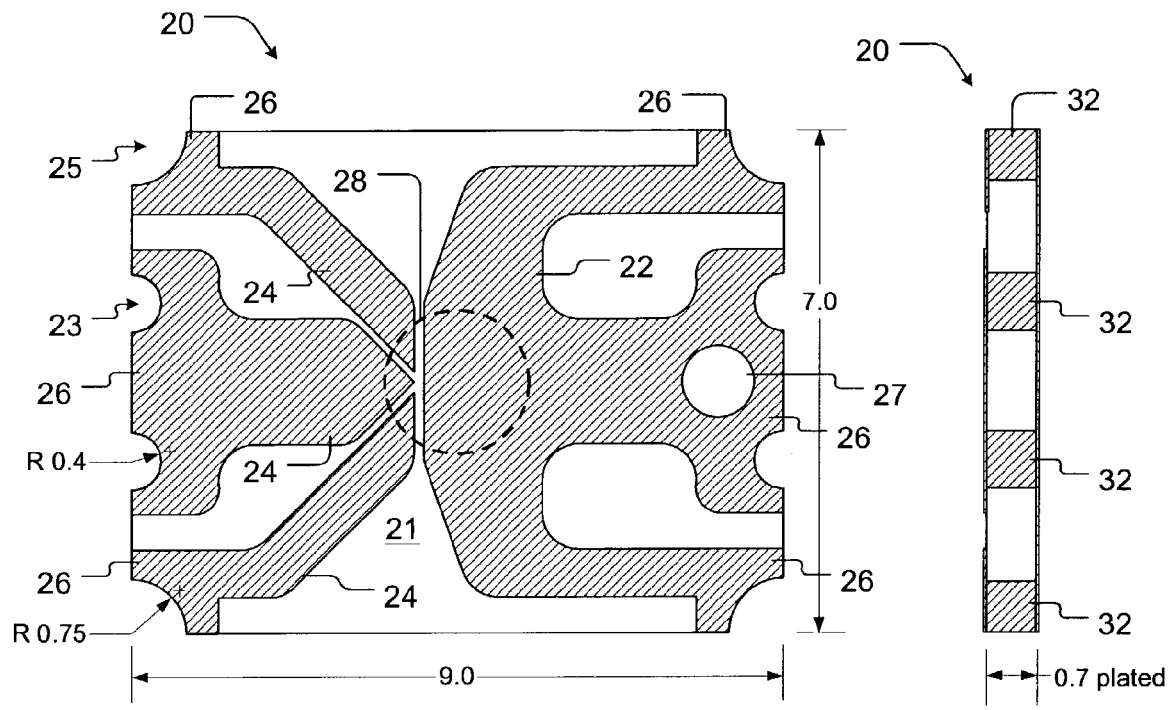
FIG. 2A is a top view of a portion of the semiconductor package of FIG. 1A.
FIG. 2B is a side view of a portion of the semiconductor package of FIG. 1A.

The topology of the traces 22 and 24 can vary widely from the topology illustrated in the Figures while still remaining within the scope of the present invention. In the Figures, three separate cathode (negative) traces 24 are shown to illustrate that three LED assemblies can be placed on the mounting pad 28, each connected to a different cathode (negative) trace; thus, the three LED assemblies may be separately electrically controllable. The traces 22 and 24 are made of conductive material such as gold, silver, tin, or other metals. The traces 22 and 24 can have dimensions as illustrated in the Figures and having thickness in the order of microns or tens of microns depending on application. For example, the traces 22 and 24 can be 15 microns thick. FIGS. 1A and 2A illustrate an orientation marking 27. Such markings can be used to identify the proper orientation of the die package 10 even after assembling the die package 10. The orientation marking 27 is not a via or a through hole. The traces 22 and 24, as illustrated, can extend from the mounting pad 28 to sides of the substrate 20.

Continuing to refer to FIGS. 1A through 2D, the substrate 20 defines semi-cylindrical spaces 23 and quarter-cylindrical spaces 25 proximal to its sides. In the Figures, to avoid clutter, only representative spaces 23 and 25 are indicated with reference numbers. The semi-cylindrical spaces 23 and the quarter-cylindrical spaces 25 provide spaces for solder to flow-through and solidify-in when the die package 10 is attached to a printed circuit board (PCB) or another apparatus (not shown) to which the die package 10 is a component thereof. Moreover, the semi-cylindrical spaces 23 and the quarter-cylindrical spaces 25 provide convenient delineation and break points during the manufacturing process.

The substrate 20 can be manufactured as one individual section of a strip or a plate having a plurality of adjacent sections, each section being a substrate 20. Alternatively, the substrate 20 can be manufactured as one individual section of an array of sections, the array having multiple rows and columns of adjacent sections. In such configuration, the semi-cylindrical spaces 23 and quarter-cylindrical spaces 25 can be utilized as tooling holes for the strip, the plate, or the array during the manufacturing process.

Furthermore, the semi-cylindrical spaces 23 and the quarter-cylindrical spaces 25, combined with scribed grooves or other etchings between the sections, assist in separating each individual substrate from the strip, the plate, or the wafer. The separation can be accomplished by introducing physical stress to the perforation (semi through holes at a close pitch) or scribe lines made by laser, or premolded, or etched lines (crossing the semi-cylindrical spaces 23 and the quarter-cylindrical spaces 25) by bending the strip, the plate, or the wafer. These features simplify the manufacturing process thus reducing costs by eliminating the need for special carrier fixtures to handle individual unit of the substrate 20 during the manufacturing process. Furthermore, the semi-cylindrical spaces 23 and the quarter-cylindrical spaces 25 serve as via holes connecting the top solder pads 26, the side solder pads 32, and the bottom solder pads 34.

The substrate 20 has a bottom surface 29 including a thermal contact pad 36. The thermal contact pad 36 can be fabricated using material having high thermally and electrically conductive material such as gold, silver, tin, or other material including but not limited to precious metals.

Figure 3:
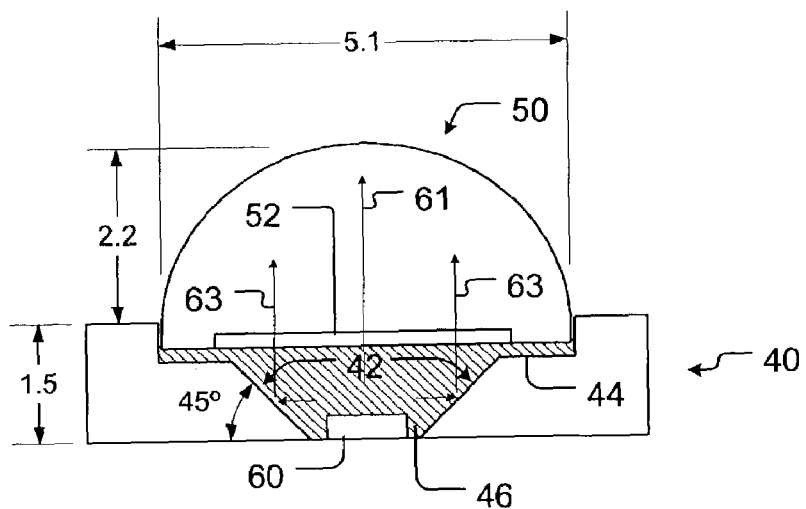
FIG. 3 is a cut-away side view of portions of the semiconductor package of FIG. 1A.

FIG. 3 illustrates a cut-away side view of portions of the semiconductor package of FIGS. 1A and 1B. In particular, the FIG. 3 illustrates a cut-away side view of the top heat sink 40 and the lens 50. Referring to FIGS. 1A, 1B, and 3, the top heat sink 40 is made from material having high thermal conductivity such as aluminum, copper, ceramics, plastics, composites, or a combination of these materials. A high temperature, mechanically tough, dielectric material can be used to overcoat the traces 22 and 24 (with the exception of the central die-attach area) to seal the traces 22 and 24 and provide protection from physical and environmental harm such as scratches and oxidation. The overcoating process can be a part of the substrate manufacturing process. The overcoat, when used, may insulate the substrate 20 from the top heat sink 40. The overcoat may then be covered with a high temperature adhesive such as thermal interface material manufactured by THERMOSET that bonds the substrate 20 to the top heat sink 40.

Figure 2C:
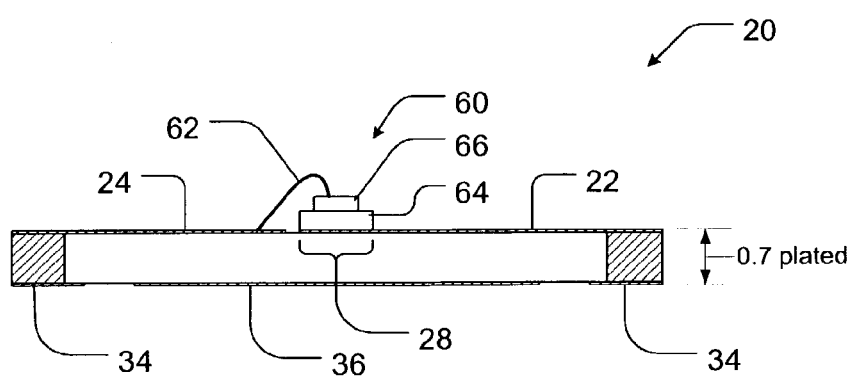
FIG. 2C is a front view of a portion of the semiconductor package of FIG. 1A.
Figure 2D:
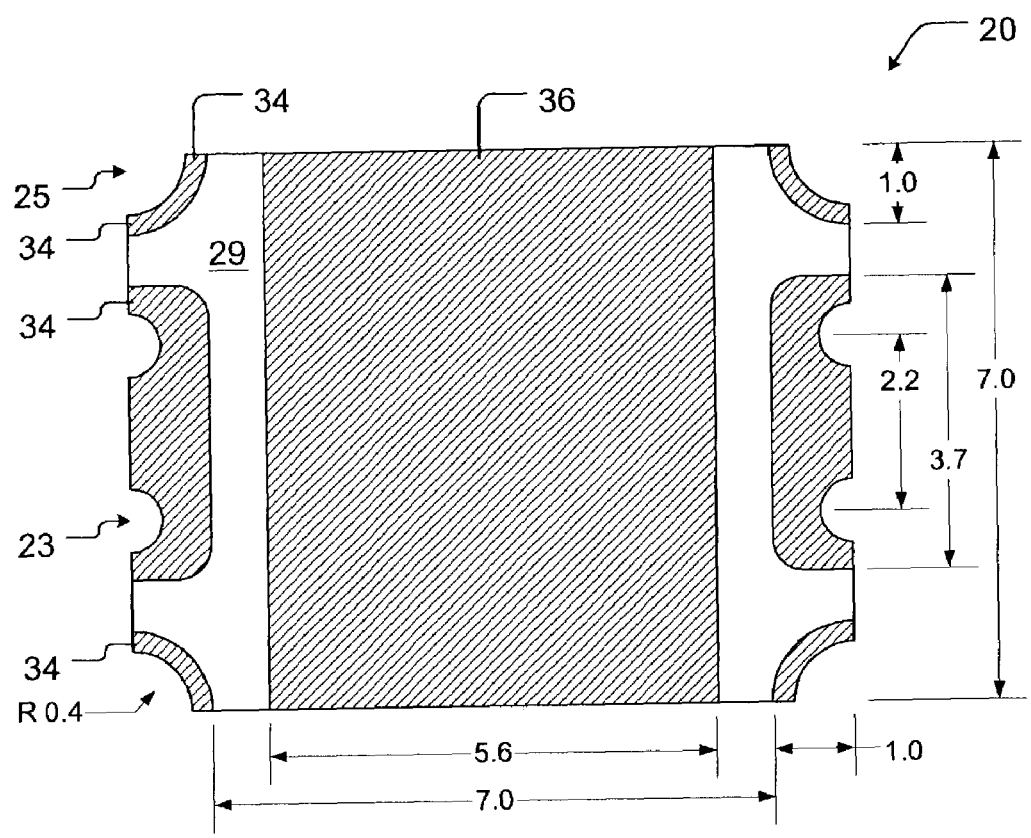
FIG. 2D is a bottom view of a portion of the semiconductor package of FIG. 1A.

The top heat sink 40 may include a reflective surface 42 substantially surrounding the LED assembly 60 mounted on the mounting pad 28 (of FIGS. 2A and 2C). When the top heat sink 40 is used to dissipate heat generated by the LED in the die package 10, it can be "top-mounted" directly on to an external heat sink by an adhesive or solder joint to dissipate heat efficiently. In another embodiment, if heat has to be dissipated by either a compressible or non-compressible medium such as air or cooling fluid, the top heat sink 40 may be made to equip with cooling fins or any feature that will enhance heat transfer between the top heat sink 40 and the cooling medium. In both of these embodiments, the electrical terminals and the bottom heat sink 20 of the die package 10, can still be connected to its application printed circuit board (PCB) using, for example, the normal surface-mount-technology (SMT) method.

The reflective surface 42 reflects portions of light from the LED assembly 60 as illustrated by sample light rays 63. Other portions of the light are not reflected by the reflective surface 42 as illustrated by sample light ray 61. Illustrative light rays 61 and 63 are not meant to represent light traces often use in the optical arts. For efficient reflection of the light, the top heat sink 40 is preferably made from material that can be polished, coined, molded, or any combination of these. Alternatively, to achieve high reflectivity, the optical reflective surface 42 or the entire heat sink 40 can be plated or deposited with high reflective material such as silver, aluminum, or any substance that serves the purpose. For this reason, the top heat sink 40 is also referred to as a reflector plate 40. The reflector plate 40 is made of material having high thermal conductivity if and when required by the thermal performance of the package 10. In the illustrated embodiment, the reflective surface 42 is illustrated as a flat surface at an angle, for example 45 degrees, relative to the reflective plate's horizontal plane. The present invention is not limited to the illustrated embodiment. For example, the reflective surface 42 can be at a different angle relative to the reflective plate's horizontal plane. Alternatively, the reflective plate can have a parabolic, toroid or any other-shape that helps to meet the desired spectral luminous performance of the package.

The reflective plate 40 includes a ledge 44 for supporting and coupling with the lens 50. The LED assembly 60 is encapsulated within the die package 10 (of FIGS. 1A and 1B) using encapsulation material 46 such as, for example only, soft and elastic silicones or polymers. The encapsulation material 46 is preferably high temperature polymer with high light transmissivity and refractive index that matches or closely matches refractive index of the lens 50. The encapsulant 46 is preferably not affected by most wavelengths that alter its light transmissivity or clarity.

The lens 50 is made from material having high light transmissivity such as, for example only, glass, quartz, high temperature and transparent plastic, or a combination of these materials. The lens 50 is placed on top of and adheres to the encapsulation material 46. The lens 50 is not rigidly bonded to the reflector 40. This "floating lens" design will ensure that the encapsulant 46 can expand and contract under high and low temperature conditions without problem. For instance, when the die package 10 is operating or being subjected to high temperature environment, encapsulant 46 experiences greater volumetric expansion than the cavity space that contains it. By allowing the lens 50 to float up somewhat freely on top of the encapsulant 46, no encapsulant will be squeezed out of its cavity space. Likewise, when the die package 10 is subjected to cold temperature, the encapsulant 46 will contract more than the other components that make up the cavity space for the encapsulant 46; the lens will float freely on top of the encapsulant 46 as the latter shrinks and its level drops. Hence, the reliability of the die package 10 is maintained over a relatively large temperature ranges as the thermal stresses induced on its encapsulant 46 is reduced by the floating lens design.

In some embodiments, the lens 50 defines a recess 52 having a curved, hemispherical, or other geometry, which can be filled with optical materials intended to influence or change the nature of the light emitted by the LED chip(s) before it leaves the die package 10. Examples of one type of optical materials are luminescence converting phosphors, dyes, fluorescent polymers or other materials which absorb some of the light emitted by the chip(s) and re-emit light of different wavelengths. Examples of another type of optical materials are light diffusants such as calcium carbonate, scattering particles (such as Titanium oxides) or voids which disperse or scatter light. Any single or combination of the above materials can be applied on the lens to obtain certain spectral luminous performance.

Figure 4:
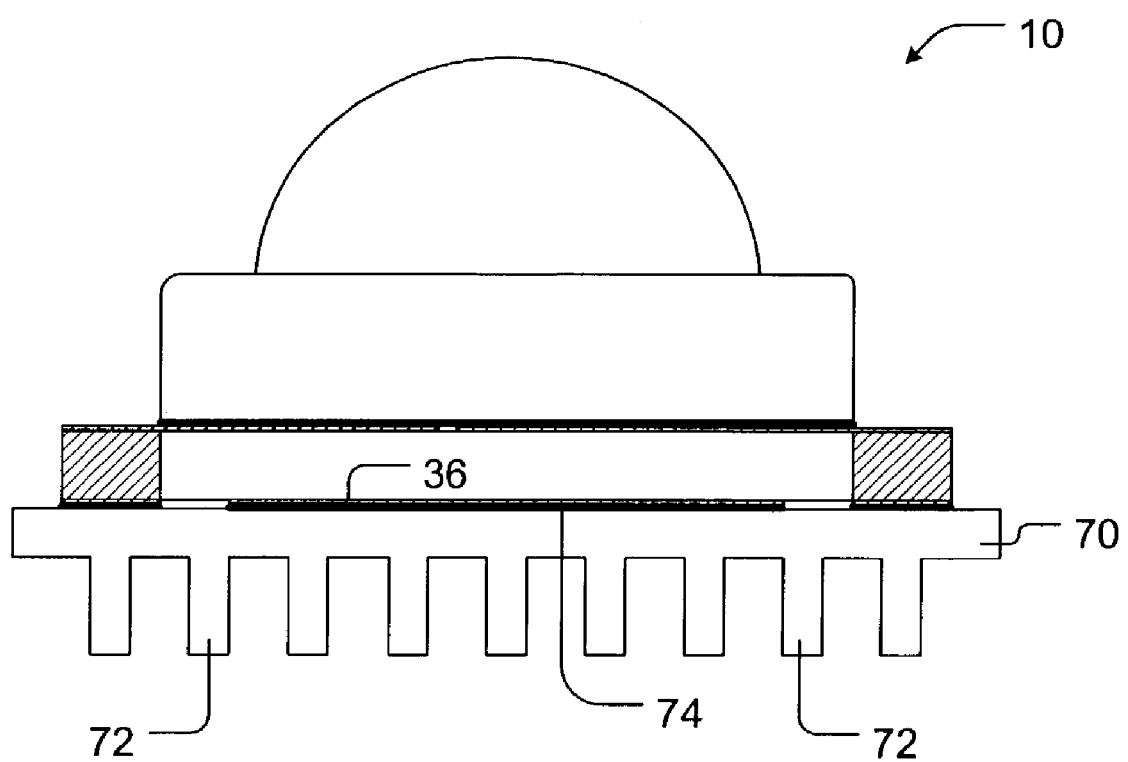
FIG. 4 is a side view of the semiconductor package of FIG. 1A with additional elements.

FIG. 4 illustrates the die package 10 coupled to an external heat sink 70. Referring to FIG. 4, the thermal contact pad 36 can be attached to the external heat sink 70 using epoxy, solder, or any other thermally conductive adhesive, electrically conductive adhesive, or thermally and electrically conductive adhesive 74. The external heat sink 70 can be a printed circuit board (PCB) or other structure that draws heat from the die package 10. The external heat sink can include circuit elements (not shown) or heat dissipation fins 72 in various configurations.

Figure 5:
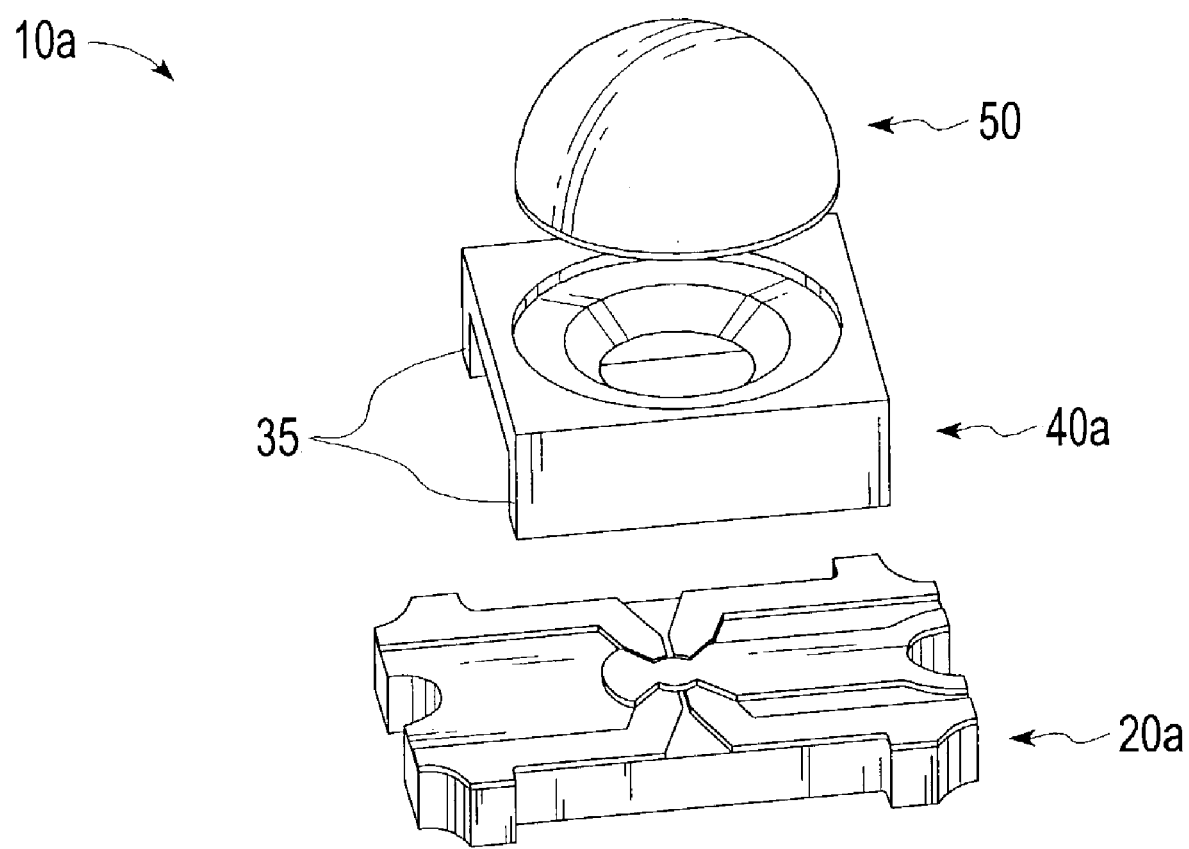
FIG. 5 an exploded perspective view of a semiconductor die package according to another embodiment of the present invention.

An embodiment of the invention having certain alternate configuration is shown in FIGS. 5 through 6D. Portions of this second embodiment are similar to corresponding portions of the first embodiment illustrated in FIGS. 1A through 4. For convenience, portions of the second embodiment as illustrated in FIGS. 5 through 6D that are similar to portions of the first embodiment are assigned the same reference numerals, analogous but changed portions are assigned the same reference numerals accompanied by letter "a," and different portions are assigned different reference numerals.

FIG. 5 is an exploded perspective view of an LED die package 10a in accordance with other embodiments of the present invention. Referring to FIG. 5, the light emitting die package 10a of the present invention includes a bottom heat sink (substrate) 20a, a top heat sink (reflector plate) 40a, and a lens 50.

FIGS. 6A, 6B, 6C, and 6D, provide, respectively, a top view, a side view a front view, and a bottom view of the substrate 20a of FIG. 5. Referring to FIGS. 5 through 6D, in the illustrated embodiment, the substrate 20a includes one first trace 22a and four second traces 24a. These traces 22a and 24a have are configured differently than the traces 22 and 24 of FIG. 2A. The substrate 20a includes flanges 31 that define latch spaces 33 for reception of legs 35 of the reflector plate 40a thereby mechanically engaging the reflector plate 40a with the substrate 20a.

From the foregoing, it will be apparent that the present invention is novel and offers advantages over the current art. Although specific embodiments of the invention are described and illustrated above, the invention is not to be limited to the specific forms or arrangements of parts so described and illustrated. For example, differing configurations, sizes, or materials may be used to practice the present invention. The invention is limited by the claims that follow. In the following, claims drafted to take advantage of the "means or steps for" provision of 35 USC section 112 are identified by the phrase "means for."

What is claimed is:

1. A light emitting die packages, comprising:
   a substrate having traces for connecting to a light emitting diode assembly at a mounting pad,
   a reflector plate coupled to the substrate and substantially surrounding the mounting pad, the reflector plate having an opening through a top horizontal surface which forms a circular sidewall that terminates at a ledge within the opening, and
   a lens substantially covering the mounting pad, wherein the lens is supported by the ledge and is free to move relative to the reflector plate due to a gap between the circular sidewall and the lens.

2. The light emitting die package recited in claim 1, further comprising a light emitting diode (LED) mounted on the substrate and connected to the traces of the substrate.

3. The light emitting die package recited in claim 2, wherein the LED is encapsulated within an optically clear polymer encapsulant, and the lens sits on the encapsulant but is free to move within the reflector plate as the encapsulant expands and contracts.

4. The light emitting die package recited in claim 1, wherein the substrate is an electrically insulating material having high thermal conductivity.

5. The light emitting die package recited in claim 1, wherein the substrate is a thermally conductive material.

6. The light emitting die package recited in claim 1, further comprising an external heat sink coupled to the substrate.

7. The light emitting die package recited in claim 6, wherein the substrate has a bottom side plated with metals for coupling with the external heat sink.

8. The light emitting die package recited in claim 1, wherein at least one trace extends from the mounting pad to a side of the substrate.

9. The light emitting die package recited in claim 1, wherein the substrate includes flanges along at least one side for mechanically engaging the reflector plate.

10. The light emitting die package recited in claim 1, wherein the reflector plate substantially surrounds the mounting pad.

11. The light emitting die package recited in claim 1, wherein the reflector plate defines a reflection surface.

12. The light emitting die package recited in claim 1, wherein the reflector plate is composed of a material having high thermal conductivity.

13. The light emitting die package recited in claim 1, wherein the reflector plate includes a plurality of legs, with at least one leg mechanically engaging the substrate for increased thermal transfer.

14. The light emitting die package recited in claim 1, wherein the reflector plate is connected to an external heat sink to allow heat from the package to be dissipated.

15. The light emitting die package recited in claim 1, wherein the reflector plate includes cooling fins for heat dissipation.

16. The light emitting die package recited in claim 1, wherein the lens includes a recess adapted to receive optical chemicals.

17. The light emitting die package recited in claim 1, wherein the lens includes luminescence converting phosphors.

18. The light emitting die package recited in claim 1, wherein the lens includes a diffusant.

19. The light emitting die package recited in claim 1, wherein the lens includes a phosphor.

20. A light emitting die package, comprising:
    a substrate including traces for connecting to an LED chip on the substrate,
    a reflector plate on the substrate and having a circular opening exposing the LED chip, the opening partially filled with an encapsulant which encapsulates the LED chip within the package, the opening forming a circular sidewall within the reflector plate that terminates at a ledge, and
    a lens supported by the ledge and which sits on the encapsulant, wherein the lens is free to move relative to the circular sidewall of the reflector plate.

21. The light emitting die package of claim 20, wherein the lens is free to move within the reflector plate as the encapsulant expands and contracts.

22. The light emitting die package of claim 20, wherein each of the substrate and reflector plate have a heat sink capability to draw away heat generated by the LED chip during package operation.

23. The light emitting die package of claim 20, wherein a gap is provided between the lens and the circular sidewall to permit lens movement within the reflector plate.

24. A light emitting die package, comprising:
    a substrate supporting an LED chip thereon that is encapsulated within an encapsulant,
    a reflector plate on the substrate and having a circular opening which forms a circular sidewall within the reflector plate, and
    a lens which sits within the opening on the encapsulant and which is free to move relative to the circular sidewall of the reflector plate as the encapsulant expands and contracts.

* * * * *